United States Patent
Sato et al.

(10) Patent No.: US 9,384,946 B2
(45) Date of Patent: Jul. 5, 2016

(54) PLASMA PROCESSING APPARATUS

(75) Inventors: Kohei Sato, Kudamatsu (JP); Kazunori Nakamoto, Kudamatsu (JP); Yutaka Ohmoto, Hikari (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 758 days.

(21) Appl. No.: 13/410,331

(22) Filed: Mar. 2, 2012

(65) Prior Publication Data

US 2013/0180662 A1     Jul. 18, 2013

(30) Foreign Application Priority Data

Jan. 12, 2012 (JP) ................................ 2012-003691

(51) Int. Cl.
| | | |
|---|---|---|
| H01L 21/683 | (2006.01) | |
| H01J 37/32 | (2006.01) | |
| H01L 21/67 | (2006.01) | |
| H01L 21/687 | (2006.01) | |

(52) U.S. Cl.
CPC ..... *H01J 37/32082* (2013.01); *H01L 21/67126* (2013.01); *H01L 21/6833* (2013.01); *H01L 21/68785* (2013.01)

(58) Field of Classification Search
CPC ..................... H01L 21/67069; H01L 21/6831; H01L 21/6833; H01L 21/68785; H01L 21/687; H01L 21/68714; H01L 21/67126; H01J 37/32642; H01J 37/32623; H01J 37/321; H01J 37/32082
See application file for complete search history.

(56) References Cited

U.S. PATENT DOCUMENTS

| | | | | |
|---|---|---|---|---|
| 5,625,526 | A * | 4/1997 | Watanabe et al. | 361/234 |
| 6,151,203 | A * | 11/2000 | Shamouilian et al. | 361/234 |
| 6,490,144 | B1 * | 12/2002 | Narendrnath et al. | 361/234 |
| 2004/0055540 | A1 * | 3/2004 | Kanno et al. | 118/724 |
| 2004/0177927 | A1 * | 9/2004 | Kikuchi et al. | 156/345.51 |

FOREIGN PATENT DOCUMENTS

| | | | |
|---|---|---|---|
| JP | 57-64950 | | 4/1982 |
| JP | 2003115529 A | * | 4/2003 |
| JP | 2003282687 A | * | 10/2003 |

* cited by examiner

Primary Examiner — Jeffrie R Lund
Assistant Examiner — Yuechuan Yu
(74) Attorney, Agent, or Firm — Baker Botts L.L.P.

(57) ABSTRACT

In a plasma processing apparatus having a processing chamber, a sample stage, a sample, a dielectric-composed insulating film and an electrode, the sample stage can be divided into an upper member and a lower member, the upper member including the insulating film and an electrode, the apparatus includes a socket which is deployed inside a through hole of the upper member, and which is electrically connected to the electrode, a pin which is brought into contact with the socket by being inserted into the socket, and a seal member which is attached onto the socket in order to implement a hermetic sealing between the upper-member side and the lower-member side inside the through hole, the upper-member side being continuously linked to the decompressed processing chamber, the lower-member side being continuously linked to the substantially-atmospheric-pressure side which is the outside of the processing chamber.

5 Claims, 8 Drawing Sheets

US 9,384,946 B2

PLASMA PROCESSING APPARATUS

BACKGROUND OF THE INVENTION

The present invention relates to a plasma processing apparatus for applying an etching processing to a board-like sample, such as a semiconductor wafer, within a processing chamber inside a vacuum vessel by taking advantage of plasma which is generated within this processing chamber.

There exists a plasma processing apparatus for performing a processing such as an etching of a sample, e.g., a semiconductor wafer, by mounting the sample on a sample stage, and taking advantage of plasma which is generated over the sample. In this plasma processing apparatus, temperature of the sample exerts a tremendous influence on its processing performance. Accordingly, temperature of the sample stage is controlled into a desired temperature distribution.

Mentionable control methods for controlling the sample-stage temperature are as follows: A heat-exchanging liquid, which is under temperature control, is caused to flow inside the sample stage. Otherwise, a heater is built-in inside the sample stage, thereby performing the heat control over the sample stage.

Here, the sample, which is mounted on the sample stage, is caused to adhere to this sample stage by taking advantage of static electricity. An exceedingly-thin insulating film is formed on the sample stage's surface on which the sample is mounted. This insulating film is formed by using a spraying method, or by pasting an exceedingly-thin insulating plate using an adhesive agent or the like. Here, the following configuration is employed: Namely, an electrode is formed on the lower-surface side of the insulating film, then applying a voltage to this electrode. This voltage application gives rise to the occurrence of polarization inside the sample with the insulating film sandwiched between the sample and the sample stage. Moreover, this polarization brings about the static electricity, which causes the sample and the sample stage to adhere to each other. This static-electricity-based adhesion force (i.e., electrostatic adhesion force) allows implementation of an enhancement in the heat conduction efficiency between the sample and the sample stage, thereby allowing implementation of an enhancement in the controllability of the sample temperature.

As an example of conventional technologies like this, there has been known a technology which is disclosed in JP-A-57-64950. In this conventional technology, the film thickness of the insulating film is made thin enough so that the sufficient electrostatic adhesion force becomes obtainable. Concretely, this film thickness is set at about 50 to 200 µm.

Furthermore, as is the case with the electrostatic-adhesion-dedicated electrode, the above-described heater is also deployed on the lower-surface side of the insulating film. As a result of this configuration, the thinner the film thickness of the insulating film is made, the smaller the heat resistance becomes which arises from the heater-deployed lower surface to the sample-mounted surface. This condition allows implementation of an enhancement in the temperature controllability of the sample-mounted surface.

SUMMARY OF THE INVENTION

By the way, the electrostatic-adhesion-dedicated electrode, which is used for holding the sample on the sample stage by taking advantage of the electrostatic adhesion, or the heater is generally deployed in the sample stage of a plasma processing apparatus as described above. A voltage supplied from a specific power supply deployed outside the sample stage is supplied to the electrostatic-adhesion-dedicated electrode or the heater like this via a power-feeding route. Here, this power-feeding route is constituted from power-feeding lines such as coaxial cables and wirings and connection units such as sockets and plugs. Meanwhile, it is difficult to form the electrode or the heater like this on the sample stage in a manner of being integrated with the above-described power-feeding route.

Also, the longer the usage time-period of the sample stage becomes, the more seriously a portion of the sample stage which includes the heater or the electrostatic-adhesion-dedicated electrode becomes corroded or contaminated. Otherwise, the more seriously the external surface of the sample stage becomes damaged or worn out. Accordingly, this portion of the sample stage becomes required to be replaced in some cases. As a result, the sample stage is required to be equipped with the following configuration: Namely, the connection between the heater-or-electrostatic-adhesion-dedicated-electrode-including sample stage's portion and a partial area of the above-described power-feeding route is released at the time of the maintenance and inspection as described above.

On account of this requirement, as the power-feeding route to the sample stage, a power-feeding route which is equipped with a removable/insertable power-feeding contact part under the heater or the electrostatic-adhesion-dedicated electrode has been considered from conventionally. A power-feeding contact part like this makes the following replaceable design implementable: Namely, depending on operation contents by the user or a request therefrom, the power-feeding route is cut off, thereby disassembling the sample stage, removing a necessary portion therefrom, and replacing the portion.

In the conventional-technology configuration like this, however, consideration is insufficient in the following point, and accordingly a problem has occurred: Namely, the power-feeding contact part is exposed to the plasma-processing atmosphere. Then, the mutual interaction therebetween produces conduction-damaging substances such as corrosion, thereby giving rise to the occurrence of a bad influence on the power transmission. As a consequence, there has existed a danger that the power-feeding capability is damaged during a long usage time-period, and that, eventually, the function of the sample stage itself becomes lowered.

Also, it is conceivable that the occurrence of the problem, i.e., the above-described lowering in the conduction performance of the power-feeding contact part, can be suppressed in accordance with the following way: Namely, the employment of a configuration for preventing particles of gases and production substances inside the processing chamber from intruding into the power-feeding contact part permits implementation of the prevention of the intrusion of these particles. An example of this preventing configuration is that the inside of the sample stage is hermetically partitioned with respect to the space inside the processing chamber, and that the inside of the sample stage is set at a high pressure. In general, however, the following operation is performed in order to allow enhancements in the temperature-adjusting performance and adhesion performance thereby to allow an enhancement in the processing performance: Namely, the insulating film, whose surface constitutes the sample-mounted surface of the sample stage, is formed using an insulating film whose film thickness is made thinner. As a result, it turns out that gaseous molecules pass through the inside of the insulating film from the high-pressure—(e.g., substantially atmospheric pressure)—set inside of the sample stage into a direction directed to the space above the sample stage within the processing chamber inside the vacuum vessel. In particular, if the insulating film is formed with ceramics by using the spraying method, it cannot be avoided that a large number of holes are formed inside the insulating film. As a consequence, there has existed a danger that the space within the processing chamber and the high-pressure area inside the sample stage become continuously linked to each other via this porous insulating-film member, and that it becomes difficult to maintain the space within the processing chamber at a high vacuum degree.

Otherwise, even if, as the above-described insulating film, a high-hermeticity insulating plate is pasted using an adhesive agent, the hermeticity of the adhesive agent is not sufficient, and thus the gaseous molecules pass through the inside of the adhesive agent. Otherwise, the adhesive agent is exposed to the plasma-processing atmosphere. As a consequence, there has existed a danger that the hermeticity becomes lowered, and that the product life-expectancy becomes shortened.

It is an object of the present invention to provide a high-reliability-ensured plasma processing apparatus which permits the performance of its sample stage to be maintained at a high level even in its long time-period usage.

The above-described object is accomplished by the following plasma processing apparatus: The sample stage is so constituted as to be dividable into an upper member and a lower member, the upper member including the insulating film and the electrode. Moreover, the plasma processing apparatus further includes a socket which is deployed inside a through hole, and is electrically connected to the electrode, the through hole passing through the upper member, a pin which is brought into contact with the socket by being inserted into the socket, and a seal member which is attached onto the socket in order to implement the hermetic sealing between the upper-member side and the lower-member side inside the through hole, the upper-member side being continuously linked to the decompressed processing chamber, the lower-member side being continuously linked to the substantially-atmospheric-pressure side which is the outside of the processing chamber.

Other objects, features and advantages of the invention will become apparent from the following description of the embodiments of the invention taken in conjunction with the accompanying drawings.

DESCRIPTION OF THE EMBODIMENTS

Figure 1A:
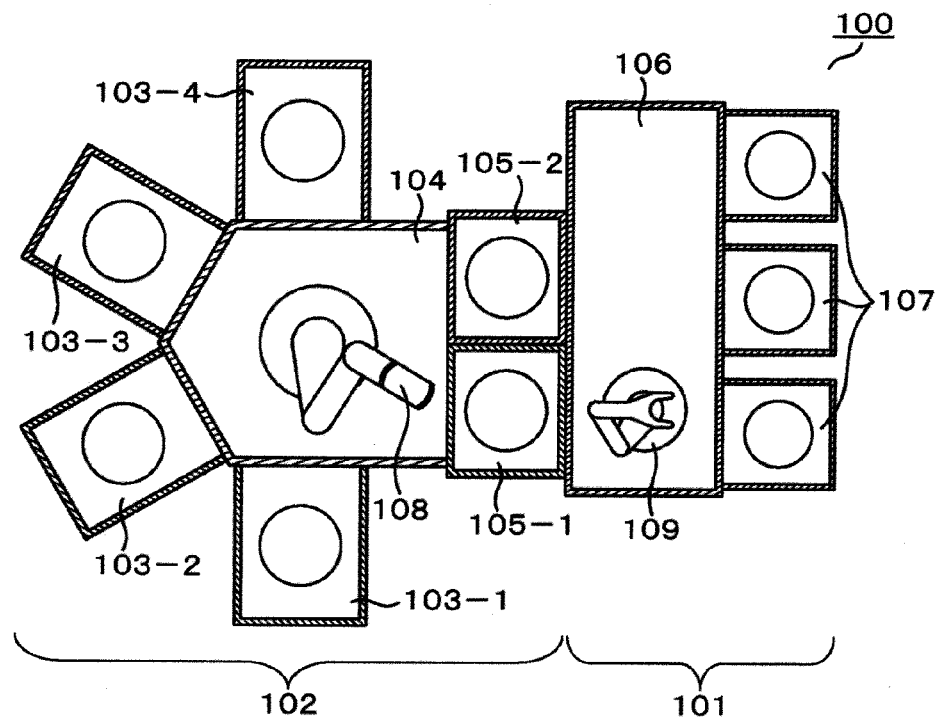
FIG. 1A and FIG. 1B are diagrams for illustrating overviews of the entire configuration of a vacuum processing apparatus which is equipped with a plasma processing apparatus according to an embodiment of the present invention.

Hereinafter, referring to the drawings, the explanation will be given below concerning an embodiment of the present invention.

The embodiment of the present invention is a plasma processing apparatus which includes a sample stage that is deployed within a processing chamber inside a vacuum vessel. While holding a board-like sample, such as a semiconductor wafer, by causing the sample to adhere thereto, the sample stage performs a processing of the sample by taking advantage of plasma which is generated in a space within the processing chamber over the sample stage. In general, in a plasma processing apparatus like this, the temperature of the sample stage, on which the sample is to be mounted, is adjusted so that this temperature becomes equal to a value within a desired range. A control over the temperature like this is performed as follows: A heat-exchanging medium, whose temperature is adjusted into a predetermined value's range, is caused to flow along a flow path deployed inside the sample stage. Otherwise, a heater is built-in inside the sample stage, then adjusting heat-liberation amount of the heater.

Also, in the present embodiment, the sample is mounted on a sample-mounted surface which is deployed on the upper portion of the sample stage. Here, the diameter of the sample-mounted surface is equal to, or is slightly smaller than the diameter of the sample. Also, the profile of the sample-mounted surface is of a circular profile, or of a circular profile whose partial portion is chipped in a specific profile. The sample is held on the sample-mounted surface by being caused to adhere thereto by taking advantage of static electricity which is generated between the sample and the sample stage. A sample-mounted surface like this, on which the sample on the sample stage is to be mounted, is constituted by deploying an insulating film on the sample stage.

This insulating film is formed by using a spraying method, or by pasting an exceedingly-thin insulating plate using an adhesive agent or the like. Here, the following configuration is employed: Namely, an electrode is formed on the lower-surface side of the insulating film, then applying a voltage to this electrode. This voltage application gives rise to the occurrence of polarization inside the sample with the insulating film sandwiched between the sample and the sample stage. Moreover, this polarization brings about the static electricity, which causes the sample and the sample stage to adhere to each other. This static-electricity-based adhesion force (i.e., electrostatic adhesion force) allows implementation of an enhancement in the heat conduction efficiency between the sample and the sample stage, thereby allowing implementation of an enhancement in the controllability of the sample temperature.

As an example of conventional technologies like this, there has been known a technology which is disclosed in JP-A-57-64950. In this conventional technology, the film thickness of the insulating film is made thin enough so that the sufficient electrostatic adhesion force becomes obtainable. Concretely, this film thickness is set at about 50 to 200 μm.

Furthermore, as is the case with the electrostatic-adhesion-dedicated electrode, the above-described heater is also deployed on the lower-surface side of the insulating film. As a result of this configuration, the thinner the film thickness of the insulating film is made, the smaller the heat resistance becomes which arises from the heater-deployed lower surface to the sample-mounted surface. This condition allows implementation of an enhancement in the temperature controllability of the sample-mounted surface.

By the way, a power-feeding route to the above-described electrostatic-adhesion-dedicated electrode or heater is equipped with a removable/insertable power-feeding contact part. This power-feeding contact part makes the following replaceable design implementable: Namely, the power-feeding line is cut off at this power-feeding contact part, thereby disassembling and replacing the sample stage.

Here, the sample stage is deployed inside the vacuum vessel. In correspondence therewith, the following two cases are conceivable: A case where the power-feeding contact part is deployed inside the plasma-processing atmosphere, and a case where the power-feeding contact part is deployed outside the plasma-processing atmosphere. The configurations of the sample stage like this are schematically illustrated in FIG. 4A and FIG. 4B, respectively.

Figure 4A:
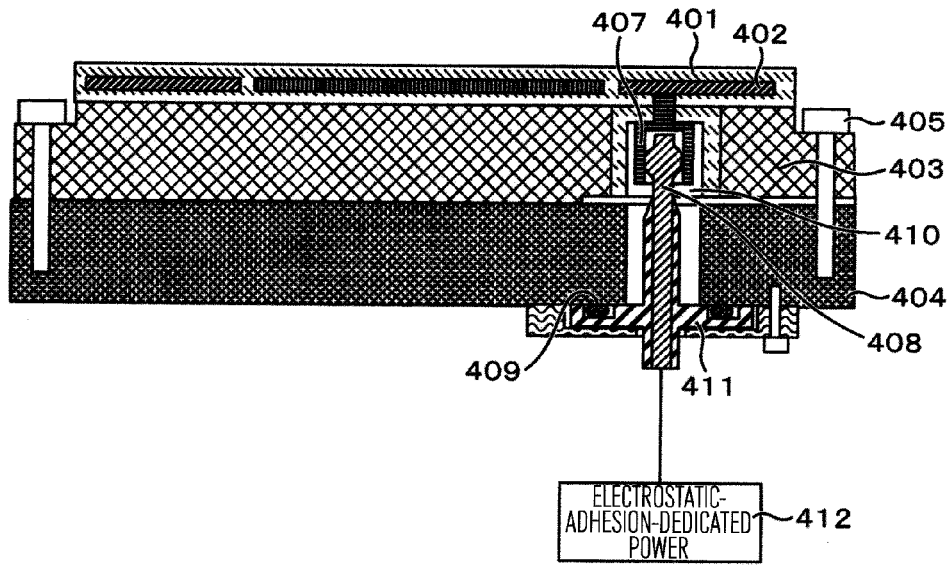
FIG. 4A and FIG. 4B are longitudinally cross-sectional diagrams for schematically illustrating overviews of the configurations of a sample stage in a common plasma processing apparatus.
Figure 4B:
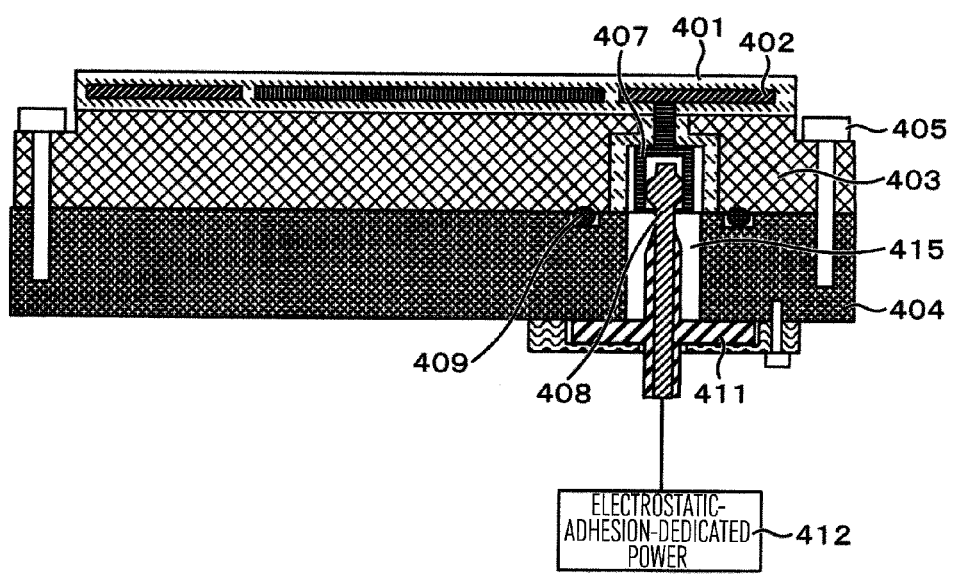

FIG. 4A and FIG. 4B are longitudinally cross-sectional diagrams for schematically illustrating overviews of the configurations of the sample stage like this in a common plasma processing apparatus. FIG. 4A illustrates the former configuration of the sample stage; whereas FIG. 4B illustrates the latter configuration of the sample stage.

In FIG. 4A, the sample stage 207 includes a substrate material 403 which is a metallic member, an insulating film 401 which is deployed on the upper surface of the substrate material 403, and which is formed of an insulating material such as ceramics, and a sample-stage base 404 which is deployed under the substrate material 403, and which is fastened with a bolt 405 at the outer-circumference portion, and whose upper surface is connected to the lower surface of the substrate material 403. Also, an electrode 402 is deployed inside the insulating film 401. This electrode 402 is formed in a film-like manner, and is used for causing a sample W to electrostatically adhere to the insulating film 401 in a state where the sample W is mounted on the insulating film 401.

Moreover, a through hole is deployed inside the substrate material 403. Also, a power-feeding contact socket 407 is deployed and stored inside the through hole. The upper-end portion of the socket 407 protrudes in an upward direction from an aperture positioned at the upper portion of the through hole, and is coupled to the rear surface of the electrode 402. This coupling connects the socket 407 to the rear surface of the electrode 402, thereby electrically connecting the electrode 402 and the power-feeding contact socket 407 to each other.

Furthermore, the sample-stage base 404 also includes a through hole which is deployed such that its central axis is aligned with the above-described through hole deployed inside the substrate material 403. The substrate material 403 and the sample-stage base 404 are fastened to each other with the fastening bolt at the convexly-profiled outer-circumference portion at which the height of the substrate material 403 is made lower. In this way, the lower surface of the substrate material 403 and the upper surface of the sample-stage base 404 are brought into contact with each other. In this state, the through hole passing through the substrate material 403 and the through hole passing through the sample-stage base 404 are also coupled as a single coupled through hole. The front-end portion of a power-feeding contact pin 408, which is inserted into the inside of this coupled through hole from under this through hole, is plugged into the inside of a concave portion of the power-feeding contact socket 407. This plug-in brings the surface of the pin 408 and the inner-side surface of the socket 407 into contact with each other, thereby electrically connecting the pin 408 and the socket 407 to each other. This electrical connection electrically connects the power-feeding contact pin 408 and the electrode 402 to each other. In this state, a predetermined DC voltage from an electrostatic-adhesion-dedicated power supply 412 is applied to the power-feeding contact pin 408. This voltage application supplies a predetermined voltage to the electrode 402 via the power-feeding contact socket 407. Here, this predetermined voltage is a voltage which is sufficient to implement the electrostatic adhesion of the sample W.

Also, the power-feeding contact pin 408 is coupled to a circular-plate-like insulating sleeve 411 at the lower-end portion of the pin 408. The upper surface of the insulating sleeve 411 is brought into contact with the lower surface of the sample-stage base 404. This contact makes it possible to fix the position of the power-feeding contact pin 408 inside the coupled through hole, thereby allowing the pin 408 to be held inside the sample stage 207. In the example illustrated in FIG. 4A, a ring-like-deployed groove is provided at the outer-circumference side portion of the power-feeding contact pin 408 on the contact surface of the insulating sleeve 411. In a state where the insulating sleeve 411 is fitted into this groove, the insulating sleeve 411 is brought into contact with the lower surface of the sample-stage base 404. This conditional contact permits the insulating sleeve 411 to include a vacuum seal 409 such as an O ring for hermetically partitioning the inside/outside of the ring.

Here, a vacuum space 410, which is hermetically partitioned by the vacuum seal 409, exists inside the coupled through hole of the sample-stage base 404 and the substrate material 403. If, however, this vacuum space 410 is not hermetically partitioned on the outer-circumference side of the connection surface between the sample-stage base 404 and the substrate material 403, it turns out that this vacuum space 410 is continuously linked to the inside of the processing chamber. As a result, it turns out that particles of gases and plasma components within the processing chamber intrude into the through hole.

Meanwhile, in the case illustrated in FIG. 4B, the vacuum seal 409 for hermetically partitioning the inside/outside in a manner of surrounding the outer circumference of the coupled through hole is deployed on the contact surface between the substrate material 403 and the sample-stage base 404. More concretely, the groove, into which the vacuum seal 409 such as an O ring is to be fitted, is deployed on the upper surface of the sample-stage base 404 on the outer-circumference side of the through hole. Then, in a state where the vacuum seal 409 is fitted into this groove, the substrate material 403 and the sample-stage base 404 are brought into contact with each other, then being fastened. In this way, the vacuum seal 409 is sandwiched from above and below, which permits the vacuum seal 409 to exhibit the sealing performance. This feature makes it possible to implement the hermetic sealing between the through hole's inside and the sample stage 207's outside, thereby allowing implementation of a reduction in the intrusion of the above-described particles.

In the case illustrated in FIG. 4A, the contact portion between the power-feeding contact socket 407 and the power-feeding contact pin 408 mutually interacts with the high-reaction particles and high-adherence particles within the processing chamber. Then, the mutual interaction produces substances such as, e.g., corrosion. As a consequence, there has existed a danger that the long time-period usage damages the conduction gradually, and that the power-feeding capability becomes lowered. Meanwhile, in the case illustrated in FIG. 4B, as long as the performance of the vacuum seal 409 is exhibited, the vacuum space 410 can be prevented from becoming continuously linked to the inside of the processing chamber via a clearance between the substrate material 403 and the sample-stage base 404. Nevertheless, if the pressure at the time when these parts have been assembled differs significantly from the pressure inside the processing chamber (it is common that the assembly and fabrication of the sample stage 207 are usually performed under the atmospheric pressure, or a pressure approximate thereto), eventually, the insulating film 401 turns out to be a portion which maintains the hermeticity between the through hole's inside and the sample stage 207's outside (i.e., the processing chamber's inside), and which withstands the pressure difference therebetween. Here, the insulating film 401 is positioned at the upper end of the through hole, and covers the upper surface of the substrate material 403. Accordingly, if the insulating film is formed by using the spraying method, there has occurred the problem that the through hole's inside and the processing chamber's inside become continuously linked to each other via the large number of gas holes which are inevitably formed inside the insulating film 401, and that the particles pass through the insulating film 401 via these gas holes. Moreover, regarding the case where, in order to solve this problem, the plate composed of a high-hermeticity insulating material is pasted using an adhesive agent, there have also occurred the following problems: Namely, the hermeticity of the adhesive agent is not sufficient, and accordingly the gaseous molecules pass through the inside of the adhesive agent. Otherwise, the adhesive agent is exposed to the plasma-processing atmosphere. As a result, the hermeticity becomes lowered, and the product life-expectancy becomes shortened.

In the present invention, in order to solve problems like this, the portion is hermetically partitioned which is used for establishing the electrical connection between the power-to-be-supplied and film-like member (such as, e.g., the electro-static-adhesion-dedicated electrode or heater deployed at the upper portion of the sample stage) and the power-feeding line for supplying the power to this power-to-be-supplied member. Moreover, the pressure of the inside of this portion is set at a high pressure, e.g., a pressure equivalent to the atmospheric pressure, or a pressure slightly exceeding this pressure. This pressure's setting allows implementation of a reduction in the intrusion of the gases and particles from the inside of the processing chamber, thereby making it possible to suppress the occurrence of the production substances due to the corrosion and mutual interaction. Simultaneously, there is provided the configuration which makes it possible to maintain the inter-inside-and-outside high pressure difference over a long time-period. These features allow implementation of a suppression of the damage to the above-described electrode-or-heater-based functions of the sample stage, thereby making it possible to exhibit the functions/effects capable of maintaining high reliability over a long time-period.

EMBODIMENTS

Hereinafter, referring to the drawings, the detailed explanation will be given below concerning embodiments of the present invention.

Figure 1B:
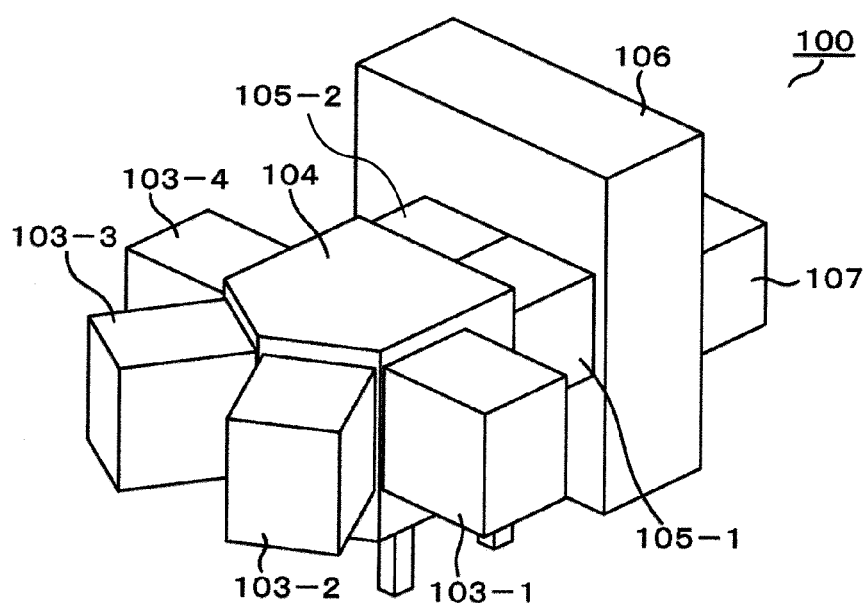

FIG. 1A and FIG. 1B are diagrams for illustrating overviews of the entire configuration of a vacuum processing apparatus which is equipped with a plasma processing apparatus according to the embodiments of the present invention. FIG. 1A is a transverse cross-sectional view of the vacuum processing apparatus seen from above, and FIG. 1B is a perspective view thereof.

In these diagrams, the vacuum processing apparatus 100 is divided into an atmospheric block 101, which is deployed at its forward side, and a vacuum block 102, which is deployed at its rear side, and is connected to the atmospheric block 101. The atmospheric block 101, which constitutes the forward-side portion of the vacuum processing apparatus 100, is a portion for transferring a sample and determining a storage position of the sample under the atmospheric pressure. The vacuum block 102, which is deployed at the backward side of the atmospheric block 101, is a portion for transferring the sample, and performing processings under a pressure decompressed from the atmospheric pressure. Lock chambers 105-1 and 105-2 are provided at the end portion of the vacuum block 102 on its atmospheric-block-101 side. Here, the pressure of the inside of each lock chamber can be decompressed down to the atmospheric pressure, or a pressure equivalent to that of the processing chamber or a vacuum transfer chamber 104 in a state where the sample stored in each lock chamber is mounted on a base deployed in each lock chamber. Each lock chamber is so constituted as to allow the atmospheric block 101 and the vacuum transfer chamber of the vacuum block 102 to be continuously linked to each other by using a hermetically-partitioning-capable unit such as a gate valve. Namely, the vacuum block 102 is coupled to the atmospheric block 101 with each lock chamber used as the interface.

The atmospheric block 101 includes a housing 106 which is equipped with a transfer robot 109 in its inside. A plurality of cassette bases 107 are deployed on the front-surface side of this housing 106. Here, a cassette which stores therein a processing-dedicated or cleaning-dedicated sample is mounted on each cassette base 107. The transfer robot 109 performs the following operations: Namely, the robot 109 takes out a before-processed wafer out of a cassette mounted on each cassette base 107, then transferring this wafer into a lock chamber through the space inside the housing 106 whose pressure is set at the substantially atmospheric pressure. Otherwise, the transfer robot 109 takes out an after-processed wafer out of the lock chamber, then restoring this wafer back to the source position of the source cassette.

The vacuum block 102 includes processing units 103-1, 103-2, 103-3, and 103-4, each of which includes the processing chamber whose inside is to be decompressed, and the vacuum transfer chamber 104, and the lock chambers 105-1 and 105-2. Here, in each processing unit, a sample deployed inside the processing chamber is processed using plasma generated inside the processing chamber. Also, the sample is transferred into these processing units under the decompressed pressure through the vacuum transfer chamber 104. Also, the lock chambers 105-1 and 105-2 establish the connection between the vacuum transfer chamber 104 and the atmospheric block 101. A transfer robot 108 for transferring the sample between the lock chamber 105-1 or 105-2 and the processing units 103-1, 103-2, 103-3, and 103-4 is deployed at the central portion of the inside of the vacuum transfer chamber 104. This vacuum block 102 is a unit which is capable of being maintained at a high vacuum-degree pressure by being decompressed.

Figure 2:
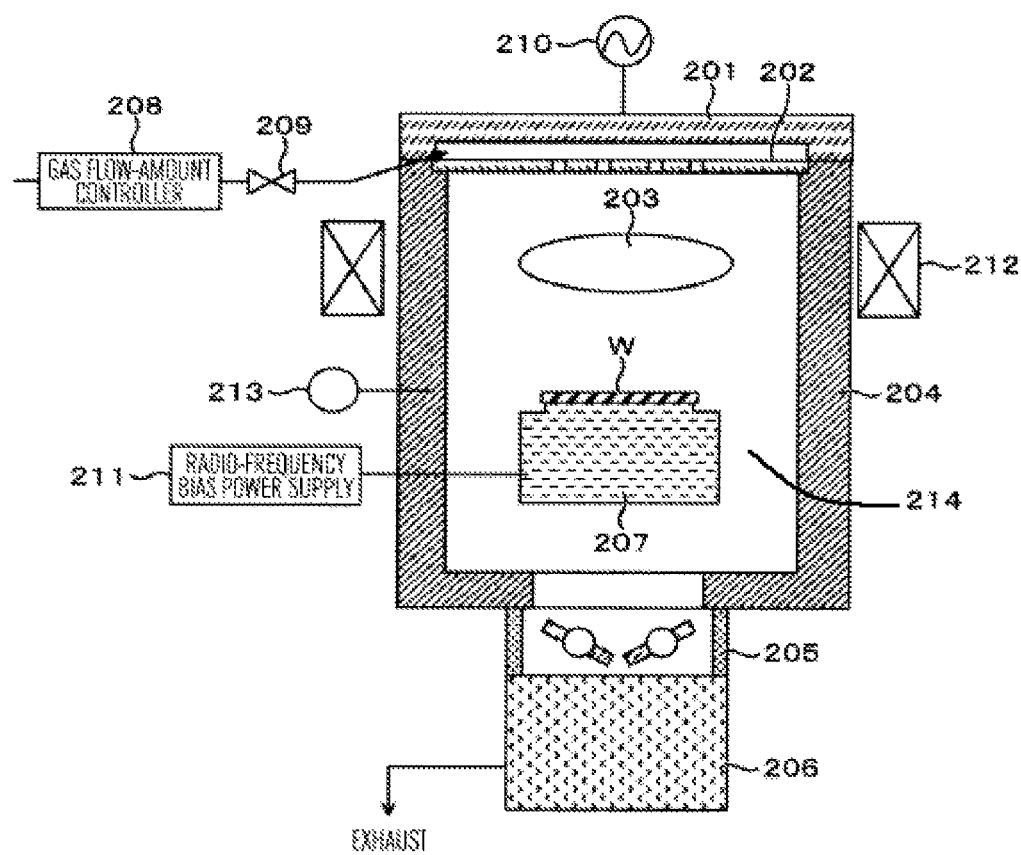
FIG. 2 is a longitudinally cross-sectional diagram for illustrating an overview of the configuration of a processing vessel included in the plasma processing apparatus of the embodiment illustrated in FIG. 1A and FIG. 1B.

FIG. 2 illustrates a schematic diagram of the configuration of the inside of a processing vessel in each processing unit 103. FIG. 2 is the longitudinally cross-sectional diagram for illustrating an overview of the configuration of the processing vessel included in the plasma processing apparatus of the embodiment illustrated in FIG. 1A and FIG. 1B.

In the present diagram, the processing vessel is constituted by including a circular-plate-like lid 201 for covering a cylindrically-profiled processing chamber 214 in its inside, and a vacuum vessel 204 which is equipped with a cylindrical portion for covering the surroundings of the processing chamber 214. The space inside the processing chamber 214 is maintained at a high vacuum degree by the operation of an exhaust unit such as a vacuum pump 206 which is deployed under the vacuum vessel 204.

A gas route is connected to the vacuum vessel 204. Here, a gas, which is used for generating plasma, is caused to flow along the gas route, then being supplied into the processing chamber 214. The gas route includes thereon a gas flow-amount controller 208 and a valve 209 for performing open/close of the gas route. The gas from a not-illustrated gas source is controlled in its flow amount by the gas flow-amount controller 208, while the gas is being caused to flow along the gas route. Moreover, the gas diffuses in a space over a gas diffusion plate 202 which is connected to the gas route at the end-portion side thereof. After that, the gas passes through a plurality of through holes deployed in the gas diffusion plate 202, then being introduced into the processing chamber 214 below. The pressure of the inside of the processing chamber 214 is adjusted as follows: Namely, based on an output from a vacuum meter 213, a not-illustrated control device transmits an instruction signal to the exhaust unit such as a conductance-adjusting valve 205 or the vacuum pump 206. Furthermore, the adjustment between the exhaust by the exhaust unit and the gas-supplied amount from the gas route allows the inside of the processing chamber 214 to be adjusted at a desired pressure.

Subsequently, the processing gas introduced into the processing chamber 214 is excited by a resonance phenomenon which occurs between a microwave-band electric field generated from a magnetron 210 and a magnetic field generated by a solenoid coil 212. This excitation of the processing gas gives rise to the generation of plasma 203. At this time, the molecules of the processing gas are ionized into ions and electrons, or are dissociated into radicals. In the present embodiment, the plasma 203 is generated by the above-described mutual interaction between the electric field and the magnetic field. The present invention, however, is not limited to this plasma-generating method.

The processing chamber 214 in which the plasma 203 is generated has a substantially cylindrical profile. The cylindrical-profile-equipped sample stage 207, on the upper surface of which the sample is to be mounted, is deployed inside the processing chamber 214. At the time of processing the sample, i.e., the target to be processed, the sample is held in a state where its position is fixed by its being mounted on the sample-mounted surface which constitutes the upper surface of the sample stage 207. In this state, the sample is processed by the plasma 203, while the heat conduction gas is being supplied to between the sample's rear surface and the sample-mounted surface.

A radio-frequency bias power supply 211 is connected to an electrical-conductor-composed and circular-plate-like electrode which is deployed inside the sample stage 207. A radio-frequency voltage is supplied from the radio-frequency bias power supply 211, then being applied to this electrode. Meanwhile, the charged particles such as the ions are generated within the plasma by an electric-potential difference between an electric potential, which is formed on the sample's surface during the generation of the plasma 203, and the electric potential of the plasma 203. Then, the above-described radio-frequency voltage applied to the electrode causes the above-described charged particles to be pulled into the surface of the sample mounted on the sample-mounted surface. As a result, the etching processing is developed by the physical reaction between the charged particles and the material of the sample's surface, or by the mutual reaction with the chemical reaction between high-energy state's active species (i.e., radicals) generated within the plasma, and the sample's surface.

An insulating film is deployed on the upper surface of the sample stage 207. Before the sample is processed, the sample is mounted on the sample-mounted surface which is constituted with this insulating film. Mentionable methods for forming this insulating film are the spraying method, and the pasting of the exceedingly-thin insulating plate.

Figure 3:
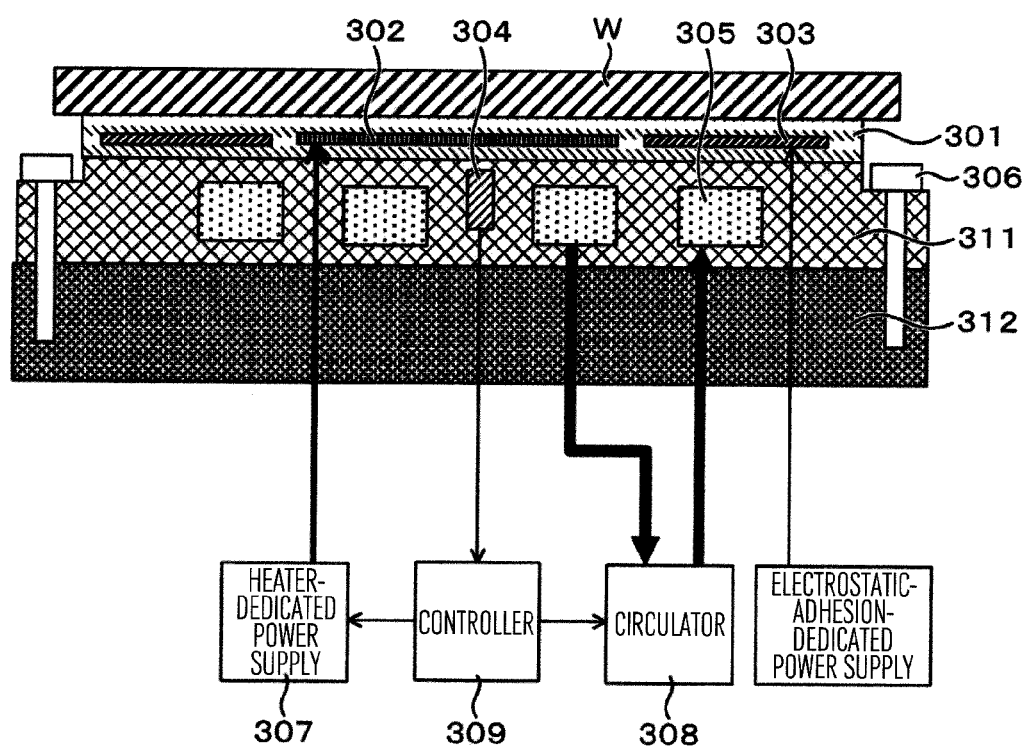
FIG. 3 is a longitudinally cross-sectional diagram for schematically illustrating an enlarged overview of the configuration of a sample stage included in the plasma processing apparatus illustrated in FIG. 2.

Next, referring to FIG. 3, the detailed explanation will be given below concerning the configuration of the sample stage 207. FIG. 3 is a longitudinally cross-sectional diagram for schematically illustrating an enlarged overview of the configuration of the sample stage included in the plasma processing apparatus illustrated in FIG. 2. The sample stage 207 is basically disassembled into the following two components, which are deployed in the upward and downward directions respectively: A substrate material 311 which is a circular-plate-like member composed of an electrically conductive material such as a metal, and a circular-plate-like sample-stage base 312 which is in contact with the lower surface of the substrate material 311, and which is fastened with a bolt 306 at the outer-circumference side portion.

In the present diagram, as is illustrated therein, a sample W is mounted on the upper surface of the sample-mounted surface constituted with an insulating film 301. Here, the insulating film 301 is deployed on the circular upper surface of the substrate material 311, i.e., the metal-composed and cylindrical member which partially constitutes the sample stage 207. A flow path 305, along the inside of which a heat-exchanging liquid is caused to flow, is deployed inside the substrate material 311. The temperature of this heat-exchanging liquid circulating the inside of the flow path 305 is adjusted into a predetermined temperature range. This adjustment allows the temperature of the upper surface of the sample stage 207 to be adjusted into a range which is suitable for the sample. This heat-exchanging liquid is controlled into desired temperature and flow amount by a circulator 308.

Moreover, in the present embodiment, a film-like heater 302 is deployed inside the insulating film 301. A DC power from a heater-dedicated power supply 307 is supplied to the heater 302, which causes the heater 302 to generate heat. This heat amount allows the temperature of the sample-mounted surface to be adjusted by being heated. The temperature of the substrate material 311 of the sample stage 207 is detected by a temperature sensor 304 deployed inside the substrate material 311. Furthermore, a controller 309 is connected to the temperature sensor 304 in a communicable manner, thereby receiving an output therefrom. This controller 309 receives the output signal of a detection result. Then, based on this detection result, the controller 309 adjusts the temperature of the heat-exchanging liquid and the magnitude of the power to be supplied to the heater 302, so that the temperature of the sample-mounted surface of the sample stage 207 or the temperature of the sample W becomes equal to a desired temperature.

In addition, a film-profiled and electrostatic-adhesion-dedicated electrode 303 is formed inside the insulating film 301. This electrostatic-adhesion-dedicated electrode 303 is used for holding the sample W on the insulating film 301 by causing the sample to adhere thereto by taking advantage of static electricity in the state where the sample W is mounted on the insulating film 301. Concretely, a DC voltage is applied to this electrode 303. This voltage application gives rise to the occurrence of polarization inside the sample W with the insulating film 301 sandwiched between the sample and the sample stage. Moreover, this polarization brings about the static electricity, which causes the sample W to adhere (i.e., electrostatically adhere) to the sample stage.

Here, it is preferable that the film thickness of the insulating film 301 be made thin enough so that the sufficient electrostatic adhesion force becomes obtainable. Also, the thinner the film thickness of the insulating film 301 is made, the smaller the heat resistance becomes which arises from the heater's position to the sample-mounted surface. This condition allows implementation of an enhancement in the temperature controllability of the sample-mounted surface. In the example indicated in the present embodiment, this film thickness is set at about 50 to 200 μm.

Figure 5:
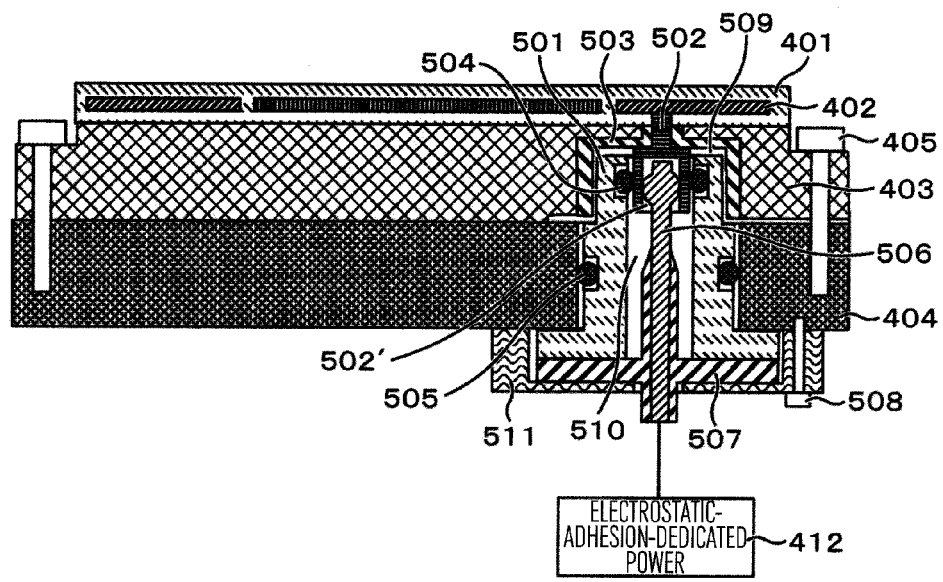
FIG. 5 is a longitudinally cross-sectional diagram for schematically illustrating an enlarged overview of the configuration of a connection unit in a power-feeding route to an electrostatic-adhesion-dedicated electrode of the sample stage illustrated in FIG. 3.

Hereinafter, referring to FIG. 5, the explanation will be given below concerning a configuration for supplying a DC power to a film-profiled and electrostatic-adhesion-dedicated electrode. In the present embodiment, there is provided a circular-plate-like substrate material which is equipped with a convex profile. Here, the height of the cross-section of this convex profile is higher at its central portion than at its outer-circumference portion. Moreover, the film-like electrode is formed using the spraying method inside an insulating film which constitutes the sample-mounted surface on the central portion of the above-described substrate material. Furthermore, the film-like electrode includes, on its rear-surface side, a connection unit (such as, e.g., a coaxial cable) which is connected to a power-feeding wiring. Here, this power-feeding wiring is deployed inside a through hole which extends in the up-and-down direction of the substrate material. FIG. 5 is a longitudinally cross-sectional diagram for schematically illustrating the configuration of a connection unit like this. Incidentally, here, the explanation will be given below concerning the electrostatic-adhesion-dedicated electrode. This explanation, however, is also basically the same regarding a heater in the case where the heater is formed in a film-like manner inside the insulating film using the spraying method.

In the example illustrated in the present drawing, the insulating film 401 in a predetermined thickness is deployed on the upper surface of the convex portion of the substrate material 403 which constitutes the sample stage 207. The electrostatic-adhesion-dedicated electrode 402 is deployed inside the insulating film 401. In this drawing, the film thickness of the insulating film 401 is illustrated more thickly than its real thickness. It is preferable, however, that, actually, the film thickness be made thin enough.

A power-feeding contact socket 502 is deployed on the rear-surface side of the electrode 402. More specifically, the power-feeding contact socket 502 is stored inside a through hole which is equipped with an aperture on the upper surface of the convex portion of the substrate material 403. Also, the upper-end portion of the socket 502 protrudes in an upward direction from the aperture, and is coupled to the rear surface of the electrode 402. The power-feeding contact socket 502 in the present embodiment is an integrally-formed and electrically-conductive member which is formed by coaxially connecting to each other a plurality of cylindrical portions of different diameters. The external profile of the socket 502 is such that the diameter of its upper portion is made smaller. A concave portion 502' is deployed at the central portion of the lower portion of the cylindrical portion of the larger diameter. Here, the concave portion 502' constitutes a cylindrically-profiled space which is equipped with an aperture on the lower surface of the cylinder. In the present embodiment, the axis of the cylindrical profile of the concave portion 502' is also deployed coaxially with the axes of the cylindrical profiles of the upper and lower portions.

The upper surface of the cylinder's upper portion and the rear surface of the electrode 402 are coupled to each other. This coupling electrically connects the electrode 402 and the power-feeding contact socket 502 to each other. Furthermore, a power-feeding contact pin 506 is inserted into the inside of the above-described through hole of the substrate material 403 from under the through hole. Namely, the front-end portion of the power-feeding contact pin 506 is plugged into the inside of the concave portion 502'. This plug-in brings the surface of the pin 506 and the inner-side surface of the socket 502 into contact with each other, thereby electrically connecting the pin 506 and the socket 502 to each other. This electrical connection electrically connects the power-feeding contact pin 506 and the electrode 402 to each other. In this state, a predetermined DC voltage is applied to the power-feeding contact pin 506. This voltage application supplies a predetermined voltage to the electrode 402 via the power-feeding contact socket 502. Here, this predetermined voltage is a voltage which is sufficient to implement the electrostatic adhesion of the sample W.

The sample stage 207 includes the substrate material 403 which includes the insulating film 401 on its upper surface, and the circular-profile-equipped sample-stage base 404 which is connected to the circular-profile-equipped lower surface of the substrate material 403 by being brought into contact therewith. The sample-stage base 404 also includes a through hole which is deployed such that its central axis is aligned with the above-described through hole deployed inside the substrate material 403. The substrate material 403 and the sample-stage base 404 are fastened to each other with the fastening bolt 405 at the convexly-profiled outer-circumference portion at which the height of the substrate material 403 is made lower. In this way, the lower surface of the substrate material 403 and the upper surface of the sample-stage base 404 are brought into contact with each other. In this state, the through hole passing through the substrate material 403 and the through hole passing through the sample-stage base 404 are also coupled as a single coupled through hole.

An insulating-material-composed and cylindrically-profiled insulating sleeve 503 is inserted into and is pasted on the inside of the through hole of the substrate material 403. Here, this insulating sleeve 503 is inserted into the through hole in such a manner that the sleeve 503 contacts and covers the inner wall of the through hole. After this insulating sleeve 503 has been inserted into the through hole, as will be described later, the power-feeding contact socket 502 is inserted into the inside of a concave portion positioned at the central portion of this insulating sleeve 503. This insertion pastes the power-feeding contact socket 502 and the insulating sleeve 503 with each other, thereby allowing the position of the socket 502 to be fixed. The outer-side wall of the lower portion of the cylindrical portion of the power-feeding contact socket 502 is deployed in such a manner that a clearance is opened between the outer-side wall and the inner-side wall of the concave portion of the insulating sleeve 503. Here, this deployment is performed in the state where the position of the outer-side wall is fixed inside the concave portion of the cylindrical profile of the insulating sleeve 503.

Moreover, there is provided an insulating sleeve 501 which is equipped with a plurality of cylindrical profiles of different diameters, and into the inside of which a cylindrical through hole is deployed. This insulating sleeve 501 is inserted into the inside of the above-described coupled through hole from under this coupled through hole. In this state, the above-described power-feeding contact pin 506 is inserted into the inside of the through hole of the insulating sleeve 501 from under the insulating sleeve 501. The insulating sleeve 501 is an integrally-formed and insulating-material-composed member where cylindrical profiles whose diameters become larger and larger in the from-upward-to-downward direction are arranged in series. The lower portion of the insulating sleeve 501 is equipped with a cylindrically-profiled or circular-plate-profiled flange portion whose diameter is made larger than the diameter of the through hole of the sample-stage base 404. The ring-profiled upper surface of the flange portion is a portion which comes into contact with the portion of the aperture's outer circumference of the through hole of the lower surface of the sample-stage base 404 in the state where the insulating sleeve 501 is inserted into the inside of the coupled through hole.

This contact allows determination of the position of the insulating sleeve 501 in its height direction. Moreover, inside the through hole of the substrate material 403, the upper-end portion of the insulating sleeve 501 enters the clearance between the inner-side wall of the concave portion of the insulating sleeve 503 and the outer-side wall of the lower portion of the power-feeding contact socket 502. This entry of the upper-end portion makes it possible to open a predetermined clearance therebetween, thereby allowing the determination of the position of the insulating sleeve 501. The resultant state resulting from these deployments turns out to be, so to speak, the following nested state: Namely, the upper portion of the cylindrical portion of the insulating sleeve 501 is inserted into the inside of the through hole of the substrate material 403 covered with the insulating sleeve 503. Simultaneously, the lower portion of the cylindrical portion of the power-feeding contact socket 502 is inserted into the inside of the through hole of the insulating sleeve 501.

Meanwhile, the power-feeding contact pin 506 is inserted in its lower portion into the central portion of an insulating-material-composed and circular-plate-like insulating sleeve 507. In this state, the pin 506 and the sleeve 507 are insulated from each other, and are connected to each other. The upper surface of the circular-plate-profiled portion of the insulating sleeve 507 is a surface which comes into contact with the lower surface of the flange portion of the lower portion of the insulating sleeve 501 in the state where the power-feeding contact pin 506 is inserted into the inside of the through hole of the insulating sleeve 501.

In this state where the insulating sleeves 501 and 507 are in contact with each other, the position of the front-end portion of the power-feeding contact pin 506 relative to the insulating sleeve 501, or the height position of the power-feeding contact socket 502, the concave portion 502', and the power-feeding contact pin 506 relative to the inner surface inside the through hole of the substrate material 403 is determined as a position at which the front-end portion's position or the height position opens a predetermined clearance between the front-end portion's position or the height position and the bottom surface (i.e., the surface equivalent to the ceiling surface which covers the space inside the concave portion 502' on the drawing) of the concave portion 502'. Also, the inner-side surface of the cylindrically-profiled space of the concave portion 502' comes into contact with the surface of a large-diameter portion or protruding portion. Here, the large-diameter portion or protruding portion is the front-end portion of the cylindrical-profile-equipped power-feeding contact pin 506, and their diameter is made larger than the diameter of the cylindrically-profiled portions above and below the front-end portion. This contact makes it possible to determine the positions of both components in the traverse direction (i.e., the right- and left direction on the drawing), and to implement the electrical contact therebetween.

The power-feeding contact pin 506 and the insulating sleeve 507 connected thereto are inserted into the inside of the through hole at the central portion of the insulating sleeve 501. Here, the insulating sleeve 501 is inserted into the inside of the through hole of the sample-stage base 404 and the substrate material 403. This insertion of the pin 506 and the sleeve 507 makes it possible to determine the positions of both components. In this state, a circular-plate-profiled or cylindrically-profiled cover 511 is deployed from under the insulating sleeve 507 in a manner of covering the insulating sleeve 507. As a result of this deployment, the cover 511 stores the insulating sleeve 507 on the inner side of the concave portion at the central portion, thereby covering the insulating sleeve 507 from thereunder. Simultaneously, the upper surface of the outer-circumference edge portion of the concave portion comes into contact with the lower surfaces of the insulating sleeves 501 and 507 of the sample-stage base 404 on the outer-circumference side. In this state, a bolt 508 is caused to pass through the cover 511, thereby being plugged into the lower surface of the sample-stage base 404. This bolt 508 makes it possible to fasten both components to each other.

At this time, the power-feeding contact socket 502 and the power-feeding contact pin 506 which is inserted therein and connected thereto open a clearance between the socket 502 and the pin 506 and the inner-side wall of the through hole of the insulating sleeve 501. This configuration holds the positions of the socket 502 and the pin 506. Also, a clearance is opened between whatever two components of the insulating sleeve 501, the substrate material 403, and the sample-stage base 404 inside the coupled through hole of the substrate material 403 and the sample-stage base 404. This configuration holds the position of the insulating sleeve 501. This configuration allows the insulating sleeves 501 and 503 to implement the electrical isolation between the substrate material 403 or the sample-stage base 404 and the power-feeding contact socket 502 or the power-feeding contact pin 506, and eventually, to implement the electrical isolation between the substrate material 403 or the sample-stage base 404 and the electrode 402.

Moreover, this insulating sleeve 501 is equipped with a groove. This groove is deployed in a ring-like manner between the inner-side wall of the through hole of the insulating sleeve 501 and the outer-side wall of the lower portion's cylindrical portion of the power-feeding contact socket 502. Simultaneously, this groove is deployed in such a manner that this groove surrounds the lower portion's cylindrical portion in the ring-like manner. In addition, this insulating sleeve 501 is equipped with a vacuum seal 504 (such as an O ring) which is fitted into this groove. This vacuum seal 504 is brought into contact with the surface of the groove of the insulating sleeve 501 and the outer-side wall of the lower portion's cylindrical portion of the power-feeding contact socket 502. As a result of this contact, this vacuum seal 504 is pressed and deformed by the surface of the groove and the outer-side wall. This deformation allows the vacuum seal 504 to implement the hermetic partitioning between the spaces above and below (the spaces above and below on the drawing) the vacuum seal 504.

Furthermore, the insulating sleeve 501 is also equipped with a vacuum seal 505 which is positioned between the insulating sleeve 501 and the substrate material 403 or the sample-stage base 404. This vacuum seal 505 is also sandwiched therebetween, which allows the vacuum seal 505 to implement the hermetic partitioning therebetween. In the present embodiment, there is provided the vacuum seal 505 (such as an O ring) which is fitted into a ring-like groove. Here, this ring-like groove is deployed on the outer-side wall of the insulating sleeve 501 between the inner-side wall of the through hole of the sample-stage base 404 and the outer-side wall of the insulating sleeve 501.

These vacuum seals 504 and 505 implement the hermetic partitioning between a space 510 and a clearance space 509. Here, the space 510 is a space existing inside the through hole of the insulating sleeve 501, and including the contact portion between the power-feeding contact socket 502 and the power-feeding contact pin 506. The clearance space 509 is a space including a clearance among the substrate material 403, the sample-stage base 404, and the insulating sleeve 501. If the hermetic sealing is not implemented between the substrate material 403 and the sample-stage base 404 at the outer-circumference side portion of the contact surface therebetween, usually, the clearance space 509 falls into the same vacuum state as that of the processing chamber. Meanwhile, the space 510 becomes a space which is partitioned from the inside of the processing chamber. As a result, the cover 511 is fastened, and the pressure inside the space 510 becomes equal to the atmospheric pressure when the inside/outside of the space 510 is hermetically partitioned, or a pressure close thereto.

Namely, the contact portion between the power-feeding contact socket 502 and the power-feeding contact pin 506 is hermetically partitioned from the processing chamber. This hermetic partitioning allows implementation of a suppression in the intrusion, into the inside of the space 510, of the corrosion gases used for a plasma-generating-and-using processing such as a plasma etching, and the in-processing-chamber reaction production substances created during the processing. This successful suppression makes it possible to reduce a lowering in the performance of the electrical connection due to the corrosion of the contact portion and the creation of the production substances. This feature permits the power-feeding performance to maintain a high reliability over a long usage time-period.

Moreover, the pressure of the clearance space 509 becomes equal to basically the same pressure as that of the inside of the processing chamber. This condition, like the example illustrated in FIG. 4B, makes it possible to form the high vacuum stably over a long time-period without implementing the hermetic sealing between the atmospheric pressure and the vacuum processing chamber such that the adhesive agent for pasting the insulating film 401, and the insulating film 401 and the substrate material 403 is sandwiched therebetween. Also, this condition makes it unnecessary to increase the film thickness of the insulating film 401 in order to implement the hermetic sealing between the space inside the sample stage 207 and the processing chamber outside the sample stage 207. This feature makes it possible to decrease the film thickness, thereby allowing implementation of an enhancement in the electrostatic adhesion force provided by the electrode 402, or implementation of a reduction in the power needed for implementing the same electrostatic adhesion force. In the present embodiment, this film thickness is set at, e.g., about 50 to 200 μm. Here, this film thickness ranges from the lower surface of the insulating film 401 on the-substrate-material-403 side to the upper surface of the insulating film 401 which is in contact with the sample.

Figure 6:
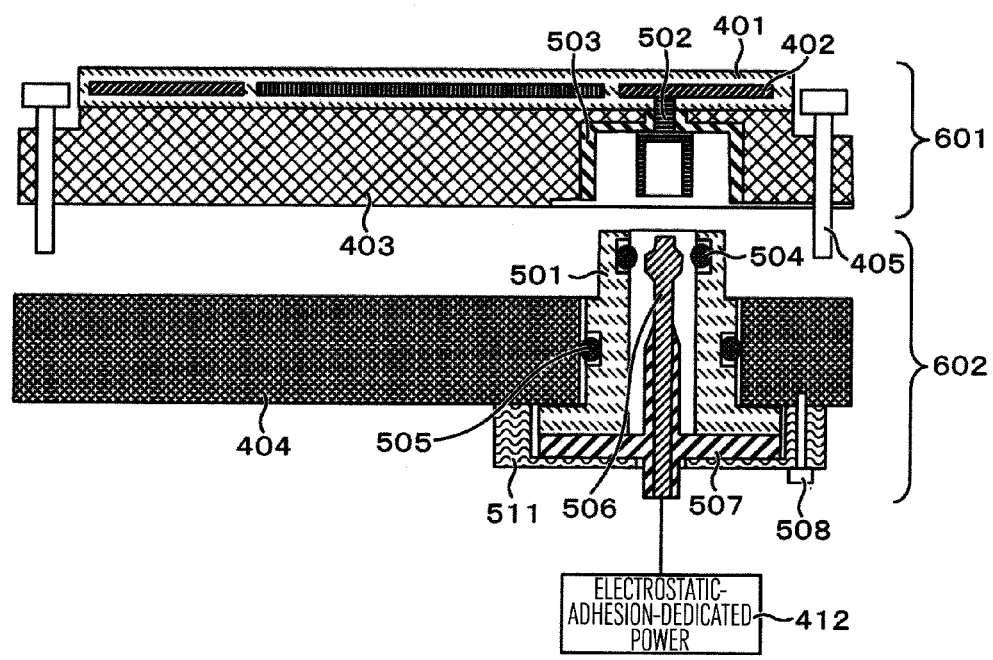
FIG. 6 is a longitudinally cross-sectional diagram for schematically illustrating a state where the sample stage illustrated in FIG. 5 is disassembled.

FIG. 6 illustrates a state where the sample stage 207 in the present embodiment is disassembled when such operations as its maintenance, inspection, and part replacement are performed. As illustrated in FIG. 6, the sample stage 207 which has been used for the plasma processing over a long time-period can be disassembled to remove its part. Next, this part can be taken out to the outside of the processing chamber. Moreover, this part can be washed, or can be replaced by a new part.

At this time, as described above, the sample stage 207 in the present embodiment includes the substrate material 403 deployed in the upward direction, and the sample-stage base 404 deployed in the downward direction, and fastened to the material 403. Then, the volt 405 is loosened and removed which has been deployed at the outer-circumference side portion for fastening both components to each other. This volt's removal basically disassembles the sample stage 207 into an upper portion 601 which includes the substrate material 403, and a lower portion 602 which includes the sample-stage base 404. Here, the front-end portion of the power-feeding contact pin 506 has been inserted into the inside of the concave portion 502', and has been brought into contact with the power-feeding contact socket 502. At the time of the above-described disassembly, the contact portion between the power-feeding contact socket 502 and the power-feeding contact pin 506 is liberated in the upward and downward directions. This liberation eliminates the electrical and physical contact therebetween.

Also, in the upper portion 601, together with the substrate material 403, the insulating film 401, the insulating sleeve 503, and the power-feeding contact socket 502 connected thereto are removed in the upward direction, and in an integrated manner. The replaceable design configuration is made implementable with these integrated components as its unit. Also, in the lower portion 602, in the state where the cover 511 is fastened to the sample-stage base 404 by the volt 508, the insulating sleeves 501 and 507, the power-feeding contact pin 506, and the cover 511 are removed in an integrated manner, and together with the sample-stage base 404.

Figure 7:
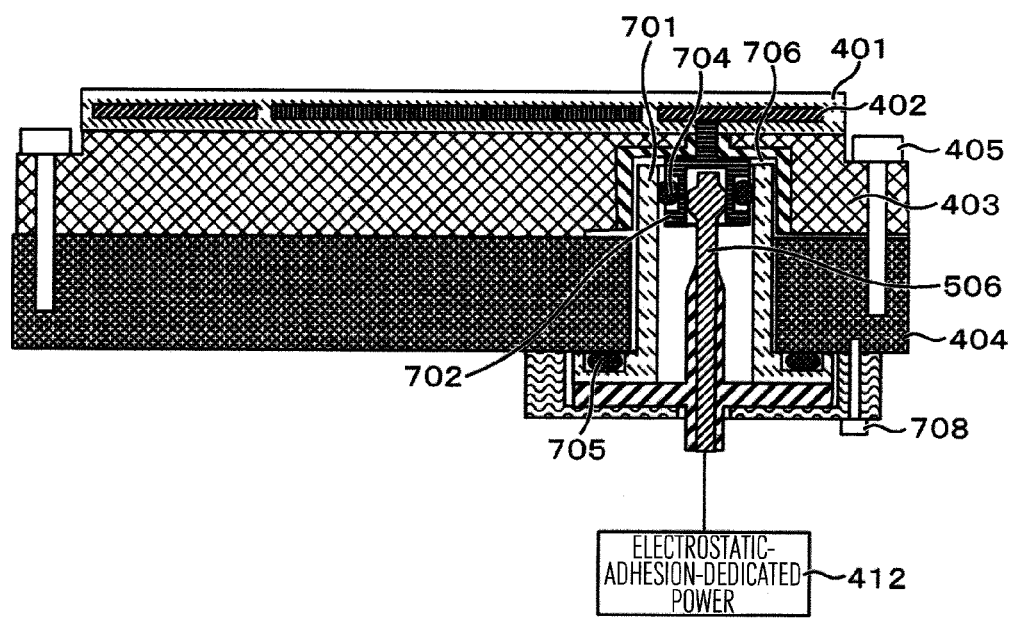
FIG. 7 is a longitudinally cross-sectional diagram for schematically illustrating an enlarged overview of the configuration of another example of the connection unit in the power-feeding route to the electrostatic-adhesion-dedicated electrode of the sample stage illustrated in FIG. 3.

As the structure of the above-described power-feeding unit, the method illustrated in FIG. 5 is merely its one example. For example, the method illustrated in FIG. 7 is allowable and implementable. The present embodiment is a modified embodiment where modification is made to the vacuum seal method based on a vacuum seal 704 between a power-feeding contact socket 702 and an insulating sleeve 701, and the vacuum seal method based on a vacuum seal 705 between the insulating sleeve 701 and the sample-stage base 404. In either of the cases, the vacuum seal surface is formed on the power-feeding contact socket. As a result, the following structure is implemented: Namely, the electrical-connection portion between the power-feeding contact socket and the power-feeding contact pin is not exposed to the plasma-processing atmosphere. Simultaneously, the entire insulating film existing on the sample-mounted surface is deployed inside the plasma processing chamber. Accordingly, the load caused by the pressure difference is not exerted on the insulating film.

FIG. 8A to FIG. 8F illustrate fabrication processing steps for coupling the power-feeding contact socket 502 to the above-described electrostatic-adhesion-dedicated electrode 402. The present drawing indicates the case where both of the insulating film 401 and the electrostatic-adhesion-dedicated electrode 402 are formed using the spraying method.

Figure 8A:
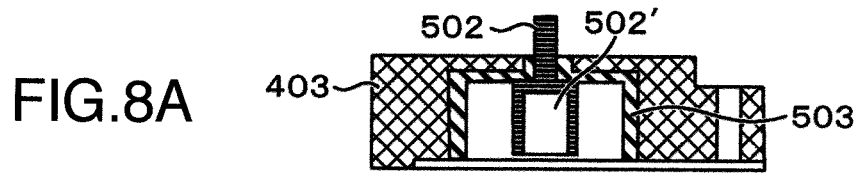
FIG. 8A to FIG. 8F are diagrams for schematically illustrating processing steps of forming the connection unit in the power-feeding route to the electrostatic-adhesion-dedicated electrode of the sample stage illustrated in FIG. 5.

In FIG. 8A, first, the insulating sleeve 503 and the power-feeding contact socket 502 are inserted into the inside of the through hole of the substrate material 403. Moreover, the sleeve 503 and the socket 502 are bonded with each other by being pasted using an adhesive agent. The profile of the inner wall of the cylindrically-profiled through hole is so constituted as to become the same profile, or the same profile within a specific tolerance range, as the profile of the surface of the cylindrically-profiled portion of the insulating sleeve 503 on its outer side. The through hole of the substrate material 403 includes a small-inner-diameter-equipped and cylindrically-profiled through hole which is deployed on the upper surface of the convex portion of the substrate material 403, and a large-inner-diameter-equipped and cylindrically-profiled through hole which is continuously linked thereto, and is deployed thereunder. Accordingly, the insulating sleeve 503 is equipped with a cylindrically-profiled outer profile which coincides with the inner surfaces of the cylindrical profiles having these small inner diameter and large inner diameter, and which has its small inner diameter and large inner diameter in correspondence therewith. Consequently, the insulating sleeve 503 is capable of covering the entire inner wall of the through hole in the state where the insulating sleeve 503 is inserted into the through hole.

Also, a through hole, into which the upper portion of the cylindrical portion of the power-feeding contact socket 502 is to be inserted, is deployed at the central portion of the bottom surface (which corresponds to the upper surface on the drawing) of the cylindrically-profiled concave portion at the central portion of the insulating sleeve 503. More specifically, the above-described through hole is deployed as follows: Namely, the profile of the through hole is so constituted as to become the same profile, or the same profile within a specific tolerance range, as the profile of the upper portion's cylindrical portion. Moreover, the through hole is continuously linked to an aperture on the upper surface of the small-inner-diameter-equipped cylindrical portion of the insulating sleeve 503. Furthermore, the upper-end portion of the upper portion's cylindrical portion of the power-feeding contact socket 502 is equipped with a height. Here, at this height, the upper-end portion protrudes sufficiently in an upward direction from the upper surface of the convex portion of the substrate material 403 in the above-described state where the upper portion's cylindrical portion is inserted into the through hole. Also, a step-difference portion exists on the portion where the upper portion's cylindrical portion and the lower portion's cylindrical portion are coupled to each other, and where the magnitude of the diameter of the power-feeding contact socket 502 becomes different. The ring-like upper surface of the step-difference portion is brought into contact with the ring-like bottom surface (the upper surface) of the concave portion of the insulating sleeve 503, then being pasted with each other. This pasting allows implementation of an increase in the strength of the bonding therebetween.

Figure 8B:
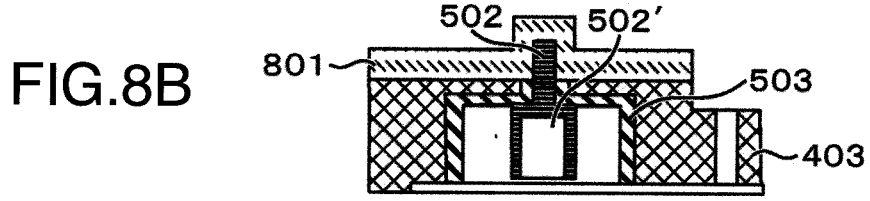

Next, an insulating film 801 is formed on the upper surface of the substrate material 403 by using the spraying method. The upper-end portion of the power-feeding contact socket 502, which protrudes in the upward direction from the upper surface of the substrate material 403, is also covered with this insulating film 801 as is the case with the upper surface of the substrate material 403 (FIG. 8B).

Figure 8C:
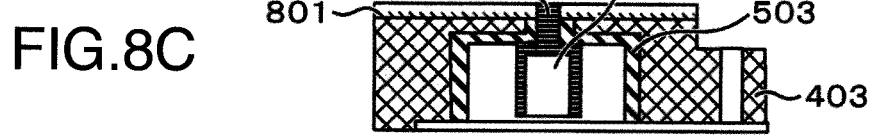

Next, the upper surface of the insulating film 801 formed by using the spraying method is polished so that the upper-surface height of the insulating film 801 from the bottom surface of the substrate material 403 becomes close to a constant value. At this time, the side surface of the power-feeding contact socket 502 is pasted with respective melted particles of the insulating film 801 to which the spraying is applied. This pasting makes it possible to suppress the position of the side surface from shifting, or to suppress the particles of the surrounding film from flaking off. The front-end portion of the power-feeding contact socket 502 is exposed onto the upper surface of the insulating film 801 which is obtained as a result of the polishing (FIG. 8C).

Figure 8D:
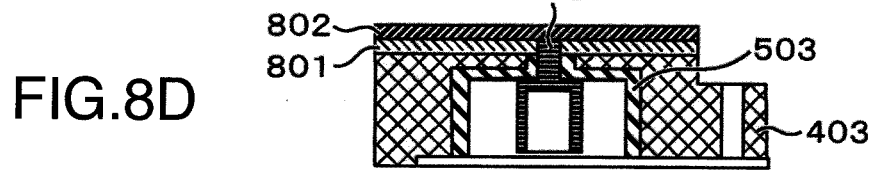

Next, using the spraying method, the film of an electrostatic-adhesion-dedicated electrode 802 is formed on the entire upper surface of the insulating film 801 which has been substantially planarized. At this time, the film of the electrostatic-adhesion-dedicated electrode 802 is also formed on the upper surface of the front-end portion of the power-feeding contact socket 502. This configuration allows implementation of the mechanical/electrical coupling therebetween (FIG. 8D).

Figure 8E:
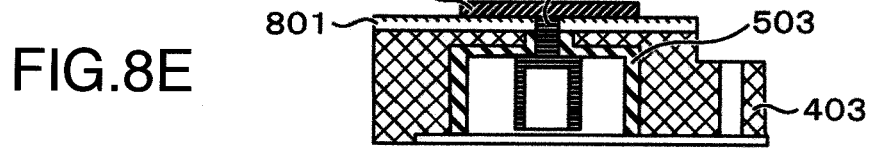
Figure 8F:
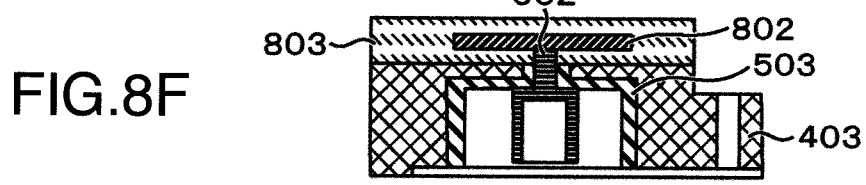

Next, the film of the electrostatic-adhesion-dedicated electrode 802, which is formed on the entire upper surface of the insulating film 801, is machined and fabricated into an arbitrary electrode-dedicated pattern profile (FIG. 8E). After that, an insulating film 803 is formed on the upper surfaces of the insulating film 801 and the electrode 802 by using the spraying method. After that, the upper surface of the insulating film 803 is polished so that the thickness of the whole of the insulating films from the upper surface of the substrate material 403 becomes equal to a value which falls into a predetermined range. In this way, the upper surface of the insulating film 803 is substantially planarized. The insulating films 801 and 803 obtained after this polishing turn out to be the above-described insulating film 401, which constitutes the sample-mounted surface of the sample W (FIG. 8F).

The material of the insulating film 803 may be the same material as that of the insulating film 801, or may be some other insulating-property material. Polishing the upper surface of the insulating film 803 into a completely planarized surface requires a tremendous amount of time and cost. Accordingly, the upper surface is polished into a planarized surface whose surface roughness allows the ensuring of a sufficient heat conduction amount or contact area between the upper surface and the sample W mounted thereon. Otherwise, the upper surface is polished into a planarized surface on which a specific groove-like or protrusion-like profile can be formed. Fabricating the insulating film 803 using methods like this permits the power-feeding contact socket 502 to be solidly brought into close contact with the substrate material 403, and to be made electrically conductive therewith.

Figure 9A:
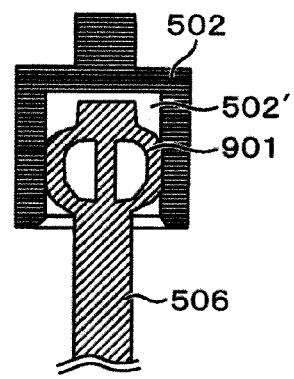
FIG. 9A to FIG. 9C are diagrams for schematically illustrating enlarged overviews of the configuration of a socket and a contact pin of the connection unit in the power-feeding route to the electrostatic-adhesion-dedicated electrode of the sample stage illustrated in FIG. 5.
Figure 9B:
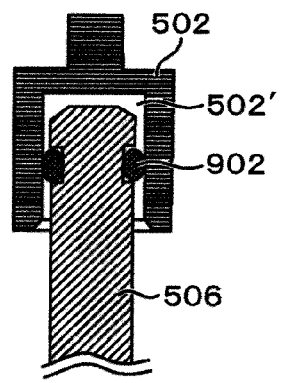
Figure 9C:
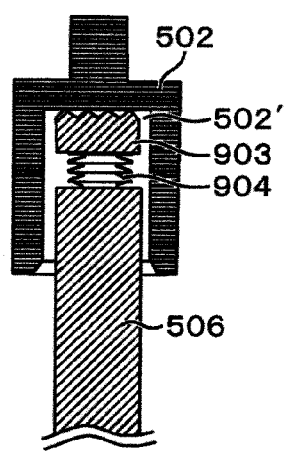

FIG. 9A to FIG. 9C illustrate the configurations of modified embodiments of the power-feeding contact socket 502 and the power-feeding contact pin 506. In the embodiment in FIG. 9A, a protruding portion 901 positioned at the front-end portion of the power-feeding contact pin 506 is formed into a roundly-swelled profile, and is equipped with a hollow cavity in its inside. The protruding portion 901 is inserted into the inside of the concave portion 502' of the power-feeding contact socket 502, thereby being brought into contact with the inner-side wall of the concave portion 502', and being pressed onto the central side (i.e., the central-axis side of the pin 506). At this time, the protruding portion 901 is caused to be crushed by a sufficient repulsive force like a spring.

Also, in the embodiment in FIG. 9B, a groove is formed on the side wall positioned at the front-end portion of the power-feeding contact pin 506, and in a manner of circulating the central axis of the pin 506. A coil-spring-based and electrically-conductive ring 902 is fitted into the inside of this groove. The front-end portion of the pin 506 is plugged into the power-feeding contact socket 502. This plug-in causes the electrically-conductive ring 902 to be crushed, and to be made electrically conductive with the socket 502.

Also, in the embodiment in FIG. 9C, the front-end portion 903 of the power-feeding contact pin 506 is pressed onto the bottom surface of the concave portion 502' of the power-feeding contact socket 502, thereby being made electrically conductive with the socket 502. The power-feeding contact pin 506 is equipped with a spring 904, i.e., an elastic body for biasing the front-end portion 903 by pressing the portion 903 onto the bottom surface of the concave portion 502'. The biasing force of this spring 904 allows both of the power-feeding contact socket 502 and the power-feeding contact pin 506 to be brought into contact with each other, and to be made electrically conductive with each other without fail.

In whatever case of FIG. 9A to FIG. 9C, the power-feeding contact socket 502 and the power-feeding contact pin 506 are fabricated with a small-electric-resistance-equipped raw material. Otherwise, the surface plating with a small-electric-resistance-equipped raw material is applied to the socket 502 and the pin 506.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising: a vacuum vessel; a processing chamber inside the vacuum vessel, wherein the processing chamber is configured to generate plasma therein, and wherein a space inside the processing chamber is configured to be decompressed; a sample stage disposed at a lower position within the processing chamber, the sample stage comprising an upper member having a cylindrical shape and a lower member which is coupled to the upper member therebeneath; an insulating film comprised of an insulating material which constitutes a sample-mounting surface on an upper surface of the upper member of the sample stage, the sample-mounting surface being configured to have a sample mounted thereon that is a target for processing with plasma; an electrode disposed inside the insulating film, power for electrostatically adhering the sample being supplied to the electrode; a through hole within the upper member and lower member of the sample stage and passing through at least the lower member, the through hole having an internal open space; an insulating sleeve which has a tubular shape and is disposed inside the open space of the through hole via a clearance space between an inner surface of the through hole, the insulating sleeve having an inner tube space, wherein the clearance space is in communication with the processing chamber via a gap between the upper member and the lower member of the sample stage; a socket unit disposed inside the inner tube space of the insulating sleeve via a distance therebetween, an upper end of the socket unit being connected to the electrode inside of the insulating film, wherein the insulating sleeve is detachably disposed from the socket unit in an upper portion of the insulating sleeve and a connecting portion of the socket unit to the electrode is disposed in the clearance space; a pin which is disposed inside the inner tube space of the insulating sleeve coming in from a lower side of the open space and is in contact with the socket unit by being inserted into an inside of the socket unit in the open space of the through hole; a first seal member which is attached onto an outside surface of the socket unit inside the inner tube space of the insulating sleeve and configured to hermetically partition the inner tube space between the clearance space and a hermetically partitioned space in which a contact portion where the inserted pin is in contact with the socket unit inside thereof is included and is at substantially atmospheric pressure, wherein at least one part of the inner tube space of the insulation sleeve is disposed inside the lower member of the sample stage; and a second seal member which is attached onto a surface of the lower member of the sample stage at an outside of the inner tube space of the insulating sleeve and configured to hermetically seal between the gap of the sample stage and the hermetically partitioned space.

2. The plasma processing apparatus according to claim 1, wherein the insulating sleeve is fixed onto an inside of the through hole, the insulating sleeve comprising an inner-circumference wall surface of the sleeve, wherein the socket unit comprises an outer-circumference side surface, and wherein the first seal member is sandwiched between the inner-circumference wall surface of the sleeve and the outer-circumference side surface of the socket unit.

3. The plasma processing apparatus according to claim 2, further comprising: wherein the second seal member is sandwiched between an inner-circumference wall surface of the through hole and an outer-circumference wall surface of the insulating sleeve.

4. The plasma processing apparatus according to claim 1, wherein a space outside of the processing chamber where a pressure is at substantially the atmospheric pressure is in communication with the hermetically partitioned space.

5. The plasma processing apparatus according to claim 4, further comprising: a power source providing electrical power to the pin, and wherein the power source is configured to supply the power for electro-statically adhering the sample mounted on the sample mounting surface.

* * * * *